United States Patent
Arbell et al.

(10) Patent No.: US 10,000,699 B2
(45) Date of Patent: *Jun. 19, 2018

(54) PHOSPHOR-NANOPARTICLE COMBINATIONS

(71) Applicants: YISSUM RESEARCH DEVELOPMENT COMPANY OF THE HEBREW UNIVERSITY OF JERUSALEM, LTD, Jerusalem (IL); QLIGHT NANOTECH LTD., Jerusalem (IL)

(72) Inventors: Hagai Arbell, Jerusalem (IL); Assaf Aharoni, Tel Aviv (IL); Uri Banin, Mevasseret Zion (IL)

(73) Assignees: YISSUM RESEARCH DEVELOPMENT COMPANY OF THE HEBREW UNIVERSITY OF JERUSALEM LTD, Jerusalem (IL); QLIGHT NANOTECH LTD., Jerusalem (IL)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/089,821

(22) Filed: Apr. 4, 2016

(65) Prior Publication Data
US 2016/0289556 A1    Oct. 6, 2016

Related U.S. Application Data

(62) Division of application No. 13/575,871, filed as application No. PCT/IB2011/050368 on Jan. 27, 2011, now abandoned.

(Continued)

(51) Int. Cl.
C09K 11/88 (2006.01)
C09K 11/02 (2006.01)
(Continued)

(52) U.S. Cl.
CPC ............ *C09K 11/883* (2013.01); *C09K 11/02* (2013.01); *C09K 11/025* (2013.01); *C09K 11/56* (2013.01);
(Continued)

(58) Field of Classification Search
CPC ..... C09K 11/883; C09K 11/02; C09K 11/025; C09K 11/56; C09K 11/565;
(Continued)

(56) References Cited

U.S. PATENT DOCUMENTS 7,102,152 B2    9/2006   Chua et al.
7,264,527 B2    9/2007   Bawendi et al.
(Continued)

FOREIGN PATENT DOCUMENTS

CN    101517035 A    8/2009
CN    101536604 A    9/2009
(Continued)

OTHER PUBLICATIONS

Jan Ziegler, Shu Xu, Erol Kucur, Frank Meister, Miroslaw Batentschuk, Frank Gindele, and Thomas Nann, Silica-Coated InP/ZnS Nanocrystals as Converter Material in White LEDs, Adv. Mater. 2008, 20, 4068-4073.*

(Continued)

*Primary Examiner* — Bijan Ahvazi
(74) *Attorney, Agent, or Firm* — Browdy and Neimark, PLLC

(57) ABSTRACT

Compositions of matter comprising a seeded semiconductor nanoparticle material and a non-quantum confined phosphor particle material for use in light conversion and light conversion layers comprising such compositions. In various embodiments, spherical core/shell seeded nanoparticles (SNPs) or nanorod seeded nanoparticles (RSNPs) are combined with a phosphor material to provide a composition of (Continued)

matter with small re-absorbance of the phosphor emission in both green and red wavelength regions and small re-absorbance of the SNP emission, In some embodiments, the SNPs or RSNPs are encapsulated in a first host material before being mixed with the phosphor particles. In various embodiments, a SNP/RSNP-phosphor mixture or encapsulated SNP/RSNP-phosphor mixture is incorporated in host matrix.

13 Claims, 7 Drawing Sheets

Related U.S. Application Data

(60) Provisional application No. 61/299,012, filed on Jan. 28, 2010, provisional application No. 61/299,018, filed on Jan. 28, 2010.

(51) Int. Cl.
| | | |
|---|---|---|
| *C09K 11/56* | (2006.01) | |
| *H01L 33/50* | (2010.01) | |
| *C09K 11/77* | (2006.01) | |
| *G02B 5/20* | (2006.01) | |
| *B82Y 30/00* | (2011.01) | |
| *B82Y 20/00* | (2011.01) | |

(52) U.S. Cl.
CPC ........ *C09K 11/565* (2013.01); *C09K 11/7706* (2013.01); *H01L 33/502* (2013.01); *H01L 33/505* (2013.01); *B82Y 20/00* (2013.01); *Y10S 977/774* (2013.01); *Y10S 977/779* (2013.01); *Y10S 977/95* (2013.01)

(58) Field of Classification Search
CPC . C09K 11/7706; H01L 33/502; H01L 33/505; G02B 5/20; B82Y 20/00; B82Y 30/00
USPC ........ 252/500, 519.4, 582; 257/88, E33.061; 428/220; 977/762, 773, 813, 824
See application file for complete search history.

(56) References Cited

U.S. PATENT DOCUMENTS

| | | |
|---|---|---|
| 7,318,651 B2 | 1/2008 | Chua et al. |
| 7,495,383 B2 | 2/2009 | Chua et al. |
| 7,645,397 B2 | 1/2010 | Parce et al. |
| 9,109,163 B2 * | 8/2015 | Arbell ................... C09K 11/02 |
| 2004/0094757 A1 * | 5/2004 | Braune ................... C09K 11/02 257/13 |
| 2005/0167684 A1 | 8/2005 | Chua et al. |
| 2008/1073886 | 7/2008 | Cheon et al. |
| 2009/0121190 A1 | 5/2009 | Parce et al. |
| 2009/0162011 A1 | 6/2009 | Coe-Sullivan et al. |
| 2013/0181234 A2 | 1/2013 | Arbell et al. |

FOREIGN PATENT DOCUMENTS

| | | |
|---|---|---|
| KR | 20090093202 A | 9/2009 |
| WO | 2008/134056 A1 | 11/2008 |
| WO | 20090162011 A2 | 8/2011 |

OTHER PUBLICATIONS

Luigi Carbone et al., Synthesis and Micrometer-Scale Assembly of Colloidal CdSe/CdS,Nano Lett., vol. 7, No. 10, 2007.*

S.P. Ahrenkiel et al "Synthesis and Characterization of Colloidal InP Quantum Rods", Nono Letters, 3:6:833-83 (2003).

Deka S et al: "CdSe/CdS/ZnS Double Shell Nonorods with High Photoluminescence Efficiency and Their Exploitation As Biolabeling Probes", Journal of the American Chemical Society, ACS Publications, US, 131:8:2948-2958 (2009).

Z. Liu et al., Status and prospects for phosphor-based white LED Packaging, Front. Optoelectron, 2009, 119-140, 2(2): 119-140, China.

Joseph R. Lakowicz, Principles of Fluorescence Spectroscopy, Kluwer Academic, 1999, pp. 367-443, 2nd edition, Plenum Publishers, New York, United States.

L. Carbone et al., Synthesis and Micrometer-Scale Assembly of Colloidal CdSe/CdS Nanorods Prepared by a Seeded Growth Approach, Nano Letters, 2007, pp. 2942-2950, vol. 7 No. 10, Washington D.C. , United States.

Liang Li and Peter Reiss, One-pot Synthesis of Highly Luminescent InP/ZnS Nanocrystals without Precursor Injection, Journal of the American Chemical Society, Aug. 8, 2008, pp. 11588-11589, vol. 130, No. 35, Washington D.C. , United States.

Young-Wook Jun et al., Shape Control of Semiconductor and Metal Oxide Nanocrystals through Nonhydrolytic Colloidal Routes,Angewndte Chemie International Edition, May 19, 2006, pp. 3414-3439, vol. 45, No. 21, Weinheim, Germany.

Dirk D et al., ZnSe Quantum Dots Within CdS Nonorods: A Seeded-Growth Type-II System, SMALL, Aug. 4, 2008, pp. 1319-1323, vol. 4, No. 9, Weinheim, Germany.

Jan Ziegler, Silica-Coated InP/ZnS Nanocrystals as Converter Material in White LEDs, Advanced Materials, Oct. 13, 2008, pp. 4068-4073, vol. 20, No. 21, Weinheim, Germany.

* cited by examiner

Known Art

Known Art

Known Art

PHOSPHOR-NANOPARTICLE COMBINATIONS

CROSS REFERENCE TO RELATED APPLICATIONS

This application claims priority from U.S. Provisional Patent Applications No. 61/299,018 filed Jan. 28, 2010 and titled "Phosphor-nanoparticle combination" and 61/299,012 filed Jan. 28, 2010 and titled "Light source with prescribed color emission", both of which are incorporated herein by reference in their entirety.

FIELD AND BACKGROUND

Embodiments of the invention relate in general to lighting devices which include light conversion materials and in particular to light conversion materials for use in lighting devices comprising light emitting diodes (LEDs), where the conversion materials include combinations of semiconductor nanoparticles and phosphors based on rare-earth elements for light conversion and light conditioning.

LEDs offer significant advantages over incandescent and fluorescent lamps with respect to their high energy efficiency and long lifetimes. LEDs are applicable in diverse applications including displays, automobile and signage lighting and domestic and street lighting. A LED can emit monochromatic light in different regions of the spectrum, depending on the inorganic semiconductor compound used to fabricate it. However, "white" light, which is required for a very large portion of the lighting industry, cannot be generated using a conventional LED. Current solutions of producing white light include the use of three or more LEDs with various colors (e.g. Red, Green and Blue or "RGB"), or the use of a color conversion layer of phosphor material (e.g. Cerium:YAG) to generate a broad white spectral emission from the ultraviolet (UV) or blue emission of a LED. However, such white light is almost always non-ideal and has in many cases undesired or unpleasant characteristics which may require improvement or correction.

For display purposes, it is important to have three or more basic colours with narrow FWHM spectrum emission, such as that obtained with LEDs (FWHM typically <30 nm). This allows large gamut coverage. "Gamut" is usually defined as: the range of chromaticities that can be obtained by mixing three colours. The solution of using three or more different LED is expensive and complicated for some applications. Therefore it is desirable to have a light source that provides large gamut coverage with one type of LED.

One method for utilizing LEDs to provide a broad-spectrum light source utilizes phosphors which convert the LED light to light having longer wavelengths in a broad spectrum. For example, a phosphor that emits light over a broad range of green wavelengths can be illuminated with blue from an LED that generates a narrow blue spectrum. The phosphor-generated green light is then used as a component of the white light source. By combining several phosphors, one can, in principle, create a broad-spectrum white light source provided the light conversion efficiencies of the phosphors are sufficiently high. More details can be found in "Status and prospects for phosphor-based white LED Packaging", Z. Liu et al., Xiaobing Front. Optoelectron. China 2009, 2(2): 119-140.

Unfortunately, a lamp designer does not have an arbitrary set of phosphors from which to choose. There are a limited number of conventional phosphors containing rare-earth elements that have sufficient light conversion efficiencies. The emission spectrum of these phosphors is not easily changed. Furthermore, the spectra are less than ideal in that the light emitted as a function of wavelength is not constant. Hence, even by combining several phosphors, an optimum white light source is not obtained.

U.S. Pat. Nos. 7,102,152 7,495,383 and 7,318,651, which are incorporated herein by reference in their entirety, disclose devices and methods for emitting output light utilizing both quantum dots (QD) and non-quantum fluorescent materials to convert at least some of the original light emitted from a light source of the device to longer wavelength light to change the colour characteristics of the output light. QD have high QY and narrow emission spectrum with a central emission wavelength (CWL) tunable by size. Combining both QD and phosphor can enhance the light quality. QD additives can offer improvement, but they suffer from high self absorbance, i.e. they absorb light that is emitted when excited. This lowers their total energy efficiency as light convertors. Moreover and most significantly, the QD also re-absorbs the phosphor emission, which reduces the energetic efficiency and also shifts the output spectrum such that rational color planning is very difficult.

Moreover, in some applications cluster of close-packed QDs is desired. Close-packed QD clusters exhibit the phenomenon known as Fluorescence Resonant Energy Transfer (FRET), see e.g. Joseph R. Lakowicz, "Principles of Fluorescence Spectroscopy", $2^{nd}$ edition, Kluwer Academic/Plenum Publishers, New York, 1999, pp. 367-443. FRET occurs between a donor QD which emits at a shorter (e.g. bluer) wavelength relative to an acceptor QD positioned in close proximity and which emits at longer wavelength. There is a dipole-dipole interaction between the donor emission transition dipole moment and the acceptor absorption transition dipole moment. The efficiency of the FRET process depends on the spectral overlap of the absorption of the donor with the emission of the acceptor. The FRET distance between quantum dots is typically 10 nm or smaller. The efficiency of the FRET process is very sensitive to distance. FRET leads to colour change (red shift) and losses in the efficiency of light conversion. Hence, in prior work efforts were made to avoid clustering of QDs in light conversion materials.

Core/shell nanoparticles (NPs) are known. These are discrete nanoparticles characterized by a heterostructure in which a "core" of one type of material is covered by a "shell" of another material. In some cases, the shell is grown over the core which serves as a "seed", the core/shell NP known then as a "seeded" NP or SNP. The term "seed" or "core" refers to the innermost semiconductor material contained in the heterostructure. FIGS. 1A-1C show schematic illustrations of known core/shell particles. FIG. 1A illustrates a QD in which a substantially spherical shell coats a symmetrically located and similarly spherical core. FIG. 1B illustrates a rod shaped ("nanorod") SNP (RSNP) which has a core located asymmetrically within an elongated shell. The term nanorod refers to a nanocrystal having a rod-like shape, i.e. a nanocrystal formed by extended growth along a first ("length") axis of the crystal with very small dimensions maintained along the other two axes. A nanorod has a very small (typically less than 10 nm) diameter and a length which may range from about 6 nm to about 500 nm.

Typically the core has a nearly spherical shape. However, cores of various shapes such as pseudo-pyramid, cube-octahedron and others can be used. Typical core diameters range from about 1 nm to about 20 nm. FIG. 1C illustrates a QD in which a substantially spherical shell coats a symmetrically located and similarly spherical core. The overall particle diameter is $d_2$, much larger than the core diameter $d_1$. The magnitude of $d_2$ compared with $d_1$ affects the optical absorbance of the core/shell NP.

As known, a SNP may include additional external shells which can provide better optical and chemical properties such as higher quantum yield (QY) and better durability. The combination may be tuned to provide emitting colors as required for the application. In a RSNP, the length of the first shell can range in general between 10 nm and 200 nm and in particular between 15 nm and 160 nm. The thicknesses of the first shell in the other two dimensions (radial axis of the rod shape) may range between 1 nm and 10 nm. The thickness of additional shells may range in general between 0.3 nm and 20 nm and in particular between 0.5 nm and 10 nm.

In view of the numerous deficiencies of known light conversion materials mentioned above, including known QD-conventional phosphor combinations there is a need for and it would be advantageous to nanoparticle-phosphor combinations and compositions of materials including such combinations which do not suffer from such deficiencies. In particular, there is a need for and it would be advantageous to have nanoparticle-phosphor combinations with small to negligible re-absorption of the phosphor emission by the nanoparticles and with small self-absorbance of the nanoparticles, thus leading to high conversion efficiencies and ultimate color gamut control. In addition, these combinations should have negligible FRET upon clustering and high-loading in the conversion materials.

SUMMARY

Embodiments of the invention disclose materials or compositions of material (also referred to as combinations or mixtures) which combine at least one phosphor species with at least one species of a semiconductor nanoparticle, specifically a SNP or RSNP. As used herein, "phosphor-SNP combination", "phosphor-RSNP combination", "phosphor-SNP mixture" or "phosphor-RSNP mixture" mean any combination which combines at least one with at least one phosphor type ("species") with at least one SNP or RSNP species. The resulting material can be a bulk material, a powder material, a thick or thin film material, self-supporting, incorporated in or combined with a matrix, and/or including added materials such as ligands. As used herein, the term "phosphor" refers to a fluorescent material present in a particulate form with an emitting center being usually an atom or ion species of a rare-earth element such as Ce, Eu or Er or others. Examples of common phosphors include Garnet-based phosphors, Silicate-based phosphors, Orthosilicate-based phosphors, Thiogallate-based phosphors, Sulfide-based phosphors and Nitride-based phosphors. Phosphor particles which can be used in combinations of the invention do not exhibit effects of quantum confinement. Non-quantum confined phosphor particles may be phosphor particles with or without a silica coating.

The inventors have found that SNPs in general and RSNPs in particular have superior optical properties which render them a much better choice for combining with phosphors in lighting applications. Specifically, the inventors have found that using a phosphor-SNP and phosphor-RSNP combinations of the invention, re-absorption effects of the phosphor emission by the SNP and self absorption of the SNP emission by SNP are small, leading to controlled color and high efficiency. In addition, in combinations containing phosphor-SNP clusters, and high loading, FRET and its undesired consequences are suppressed. RSNPs have very low photoluminescence (PL) self-absorbance and also small absorbance of the phosphor emission and thus are more energy efficient, especially in optically dense layers. A phosphor-SNP and phosphor-RSNP combination of the invention has low self absorption and re-absorption.

In some embodiments, the SNP/RSNP material is combined with a phosphor material such as listed above forming a mixture in weight percentage of 0.1-10% of SNP or RSNP relative to the phosphor. This mixture can be further inserted into a host material, typically silicone, with a 5-50% mix of conversion material to encapsulant by weight, according to the desired optical characteristic of the application. In some embodiments, a layer comprising a phosphor-SNP or phosphor-RSNP combination is used to modulate the emission spectrum of a light source. In some embodiments, the light source is a LED.

In some embodiments, a SNP-phosphor mixture may be included a layered structure comprising at least one phosphor layer and at least one SNP or RSNP layer. Various SNP and RSNP light conversion layers are disclosed in a co-pending PCT patent application by the same inventors titled "Lighting device with prescribed color emission", filed simultaneously with this application, which claims the same priority as this application and which is incorporated herein by reference in its entirety. The phosphor layer may include a single phosphor species ("type") or a mixture of several phosphor species. Alternatively, the phosphor layer may include a plurality of sub-layers, each sub-layer including a different phosphor species. A phosphor layer may have a minimum thickness limited by the size of the phosphor particles. The SNP/RSNP layer may include a single type of SNP or RSNPs, a mixture of several SNP or RSNP species or a plurality of sub-layers, each sub-layer including a different SNP or RSNP species. In some embodiments, the layered structure may comprise alternating layers of phosphors and RSNP. The thickness of a RSNP layer (without phosphor) may be smaller than 500 μm, better even smaller than 50 μm, or, for a densely-packed layer, smaller than 1 μm and even smaller than 0.2 μm. The thickness of a mixed phosphor-SNP layer can range from a few millimeters to tens of microns or even to a few microns, mainly constrained by the phosphor particle size and the required optical characteristics.

In embodiments involving modulation of the emission of a LED, a single layer or a layered structure can be formed on the LED. Alternatively, the layer or layered structure may be a separate and distinct layer or layered structure, placed directly on the LED or spaced from the LED by air, vacuum, or a filler material. The filler material (for example silicone or epoxy) may serve as a thermal isolation and/or as an optical scattering layer.

The modulation of the LED emission spectrum may be for illumination purposes, in order to produce broad-spectrum colour output light, for example "white" light, having a high colour rendering index (CRI) and the desired correlated colour temperature (CCT). The broad-spectrum colour output light is produced by converting some of the original light generated by the LED into longer wavelength light. Adding power or intensity to Red is important for obtaining "warmer" light with lower CCT (e.g. 2700-3500K), but "smoothing" specific regions in the spectrum such in the transition from blue to green can also improve the CRI. The modulation of the LED illumination may also be used for optical display purposes. The invented lighting conversion materials are also of use in agricultural applications of specific lighting demands and other areas of applications of lighting.

BRIEF DESCRIPTION OF THE DRAWINGS

Aspects, embodiments and features of the invention will become apparent from the following detailed description of the invention when considered in conjunction with the accompanying drawings. In the drawings:

(FIG. 1A) core QD/shell QD; (FIG. 1B) RSNP; (FIG. 1C) SNP;

DEFINITIONS

The term "core material" to the semiconductor material from which the core is made. The material may be II-VI, III-V, IV-VI, or I-III-VI$_2$ semiconductors or combinations thereof. For example, the seed/core material may be selected from CdS, CdSe, CdTe, ZnS, ZnSe, ZnTe, ZnO, GaAs, GaP, GaAs, GaSb, HgS, HgSe, HgTe, InAs, InP, InSb, AlAs, AlP, AlSb, Cu$_2$S, Cu$_2$Se, CuInS$_2$, CuInSe$_2$, Cu$_2$(ZnSn)S$_4$, Cu$_2$(InGa)S$_4$, alloys thereof, and mixtures thereof.

The term "shell material" refers to the semiconductor material from which each of the non-spherical elongated shells is made. The material may be a II-VI, III-V, IV-VI, or I-III-VI$_2$ semiconductor or combinations thereof. For example, the shell material may be selected from CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuInS$_2$, CuInSe$_2$, Cu$_2$(ZnSn)S$_4$, Cu$_2$(InGa)S$_4$, alloys thereof, and mixtures thereof.

The term "host material" refers to a matrix material which incorporates the SNPs or other suitable nanoparticles as well as the phosphor materials. The matrix material may be a silicone, a polymer (formed from liquid or semisolid precursor material such as monomer), an epoxy, glass or a hybrid of silicone and epoxy. Specific (but not limiting) examples of polymers include fluorinated polymers, polymers of ployacrylamide, polymers of polyacrylic acids, polymers of polyacrylonitrile, polymers of polyaniline, polymers of polybenzophenon, polymers of poly(methyl mathacrylate), silicone polymers, aluminium polymers, polymers of polybisphenol, polymers of polybutadiene, polymers of polydimethylsiloxane, polymers of polyethylene, polymers of polyisobutylene, polymers of polypropylene, polymers of polystyrene and polyvinyl polymers, polyvinyl-butyral polymers or perfluorocyclobutyl polymers. Silicones may include Gel, Elastomers and Resins such as Gel: Dow Corning® OE-6450, Elastomer Dow Corning® OE-6520, Dow Corning® OE-6550, Dow Corning® OE-6630, Resins: Dow Corning® OE-6635, Dow Corning® OE-6665, Nusil LS-6143 and other products from Nusil, Momentive RTV615, Momentive RTV656 and many other products from other vendors.

The term "ligand" refers to an outer surface coating of the nanoparticles. The coating passivates the SNP to prevent agglomeration or aggregation. Ligands in common use: phosphines and phosphine oxides such as trioctylphosphine oxide (TOPO), trioctylphosphine (TOP), tributylphosphine (TBP), phosphonic acids such as dodecylphosphonic acid (DDPA), tridecylphosphonic acid (TDPA), octadecylphosphonic acid (ODPA) or hexylphosphonic acid (HPA), amines such as dodecyl amine (DDA), tetradecyl amine (TDA), hexadecyl amine (HDA) or octadecyl amine (ODA), thiols such as hexadecane thiol or hexane thiol, mercapto carboxylic acids such as mercapto propionic acid or mercapto undecanoic acid and other acids such as oleic, myristic or palmitic acid.

DETAILED DESCRIPTION

Figure 1A:
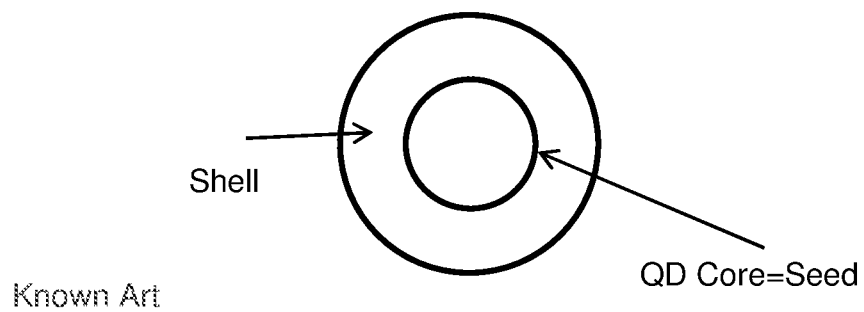
FIGS. 1A-1C is a schematic illustration of known core/shell particles.
Figure 1B:
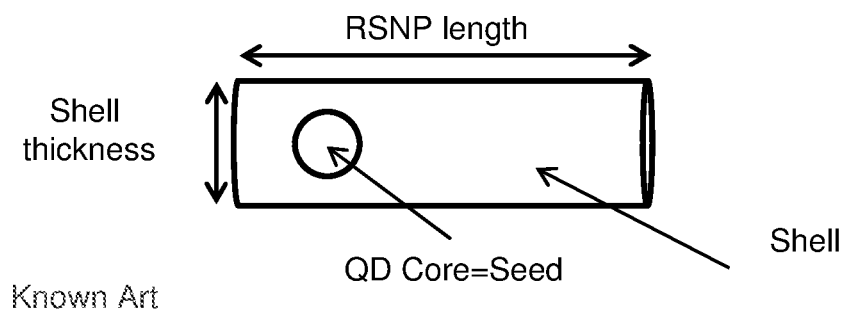
Figure 1C:
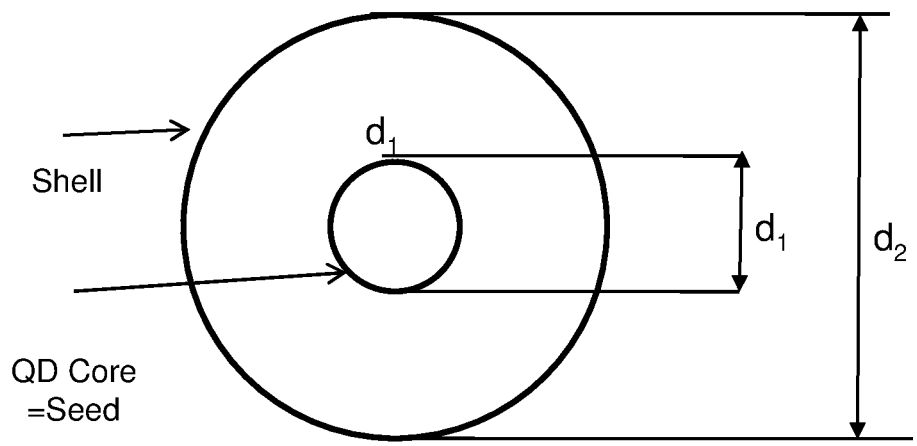
Figure 2A:
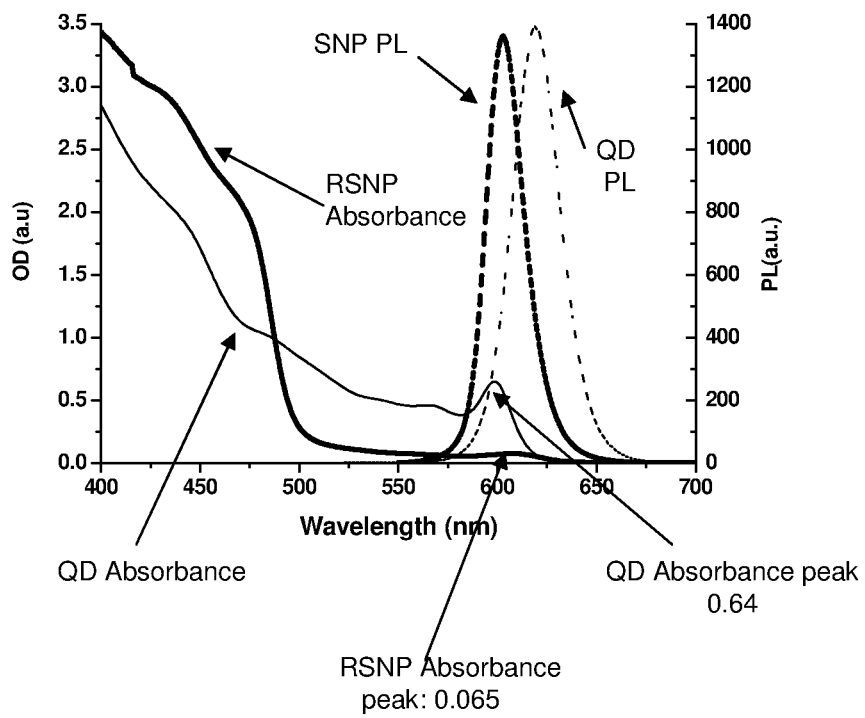
FIGS. 2A-2B shows a comparison of optical absorption and emission at around 600 nm between rod-shaped RSNP and spherical shaped QD materials.
Figure 2B:
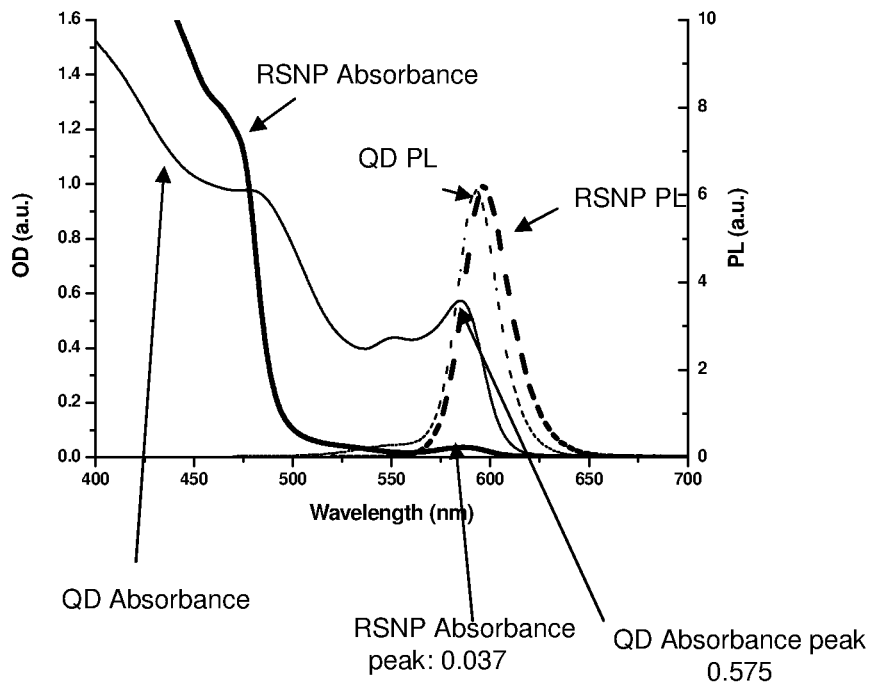

Reference is now made to FIGS. 2A, 2B, which show a comparison between the absorption and emission of a known layer which includes CdSe/ZnS core/shell quantum dot nanoparticles and two types of layers according to embodiments of the invention: a green emitting RSNP layer (FIG. 1A) and an orange emitting RSNP layer (FIG. 1B). The comparison is between the absorption and normalized emission of the QD layer vs. the RSNP layers having a matched absorption at the excitation wavelength of 450 nm. The Green RSNP layer included CdSe/CdS core/shell RSNPs with dimensions 4×27 nm (diameter×length), emitting at a center wavelength (CWL) or peak wavelength of 540 nm with a full width half maximum (FWHM) of 29 nm. The Orange RSNP layer included CdSe/CdS RSNPs with dimensions 5×40 nm, a CWL at 600 nm and FWHM of 28 nm. Both Orange and Green emitting layers were prepared in a similar way, and both were 190 μm-thick, with diameter of 42 mm.

The PL quantum yield (QY) of both QD and RSNP original nanoparticles was similar and on the order of 50%. This is a typical value. In other prepared samples, the QY ranged from 5-100%, more often between 20-90% and even more often between 50-80%. The absorption is measured in relative optical density (OD) units, where the scale shown is normalized to the range [0 1] for convenience. Significantly, for the green light emitting layers in FIG. 1A, the OD of the QD layer in the emission wavelength range (e.g. 520-550 nm) is 10 times higher than that of the RSNP layer (0.64 vs. 0.065). The OD difference for the orange emitting layers in FIG. 2B is even higher (0.575 vs. 0.037, a factor of ~15). In other examples (not shown), the OD in the emission range of a QD layer was found to be 3-30 times higher than that of a SNP layer. Therefore, losses due to self-absorbance are significant for the QD layer case and negligible for the SNP layer case. This property is used in various SNP layers of the invention (whether densely-packed or not) to provide far superior products over existing layers based on quantum dots.

Figure 3:
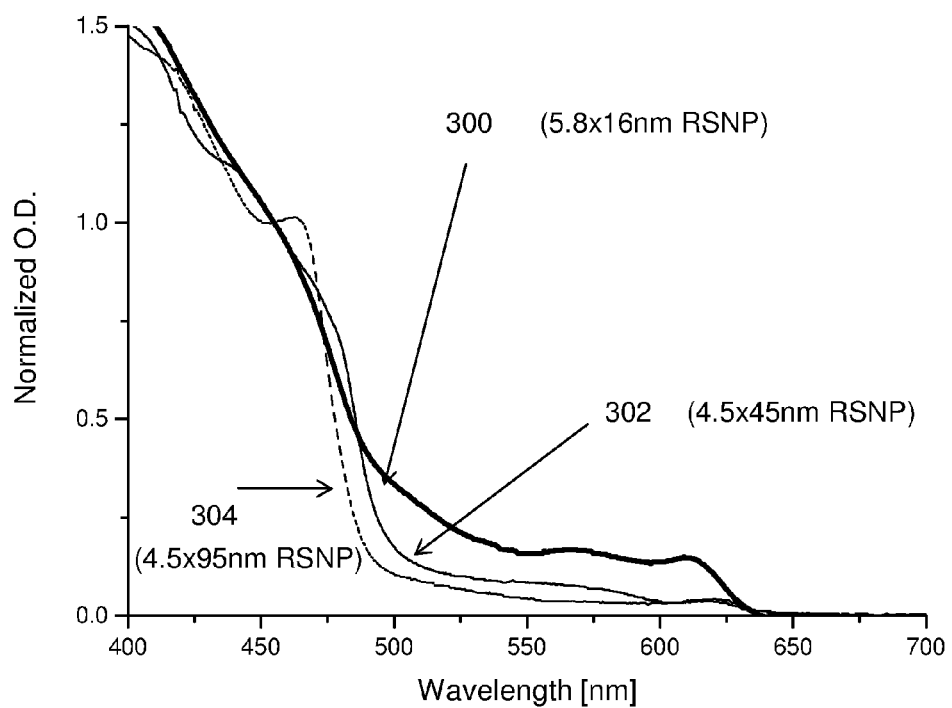
FIG. 3 shows normalized absorption curves of three types of RSNP layers prepared according to methods described below and comprising in each case red emitting RSNPs (CdSe/CdS) having different overall dimensions and nearly similar emission spectra

FIG. 3 shows normalized absorption curves of three types of RSNP layers prepared as described in Example 1 of co-filed PCT application No. PCT/IB2011/050366 titled "Lighting devices with prescribed color emission": RSNPs were synthesized following similar procedures to those described in L. Carbone et al. "Synthesis and Micrometer-Scale Assembly of Colloidal CdSe/CdS Nanorods Prepared by a Seeded Growth Approach" Nano Letters, 2007, 7 (10), pp 2942-2950, and comprising in each case CdSe/CdS structures having different overall dimensions and nearly similar emission spectra: a curve 300 for 5.8×16 nm RSNPs with 622 nm emission, a curve 302 for 4.5×45 nm RSNPs with 625 nm emission and a curve 304 for 4.5×95 nm RSNPs with 628 nm emission. These curves illustrate minimal re-absorbtion in the different materials. The absorption curves are normalized to OD 1 at 455 nm. The "absorption ratio" between absorption at 455 nm to that at the emission wavelengths is respectively 1:5, 1:12 and 1:23 for RSNP layers with RSNPs of lengths 16, 45 and 95 nm. This shows that the absorption ratio is "tunable" by varying the RSNP length, allowing to control and minimize the undesirable re-absorbtion effect. This tunability is very useful in RSNP layers since it allows the RSNP layers to act as the efficient spectral antenna to convert blue light to red light desired in a light source and application. An additional parameter resulting from this special characteristic of RSNP layer is that it allows to efficiently balance the light between the different spectral regions of the visible spectrum (say green-yellow emitted by CE:YAG and the red emitted by RSNPs) to obtain light with required characteristic (such as CCT and CRI).

A combination of material in a layer disclosed herein can be realized using semiconducting nanocrystals, in particular particles from II-VI, III-V and I-III-VI$_2$ groups, more particularly II-VI RSNPs with a core diameter from 2 to 7 nm, a shell length from 8 to 500 nm long and a shell diameter from 5 to 20 nm, or II-VI or III-V or I-III-VI$_2$ core shell nanocrystals with a very thick shell that covers the core with a layer of more than 3 nm thickness, resulting in particles with diameter larger than 8 nm. The RSNP material is combined with phosphor material from the list above with a mixture in weight percentage of 0.2-10% of SNP or RSNP. This mixture can be further inserted into a host material, typically silicone, with a 5-50% mix of conversion material to encapsulant by weight, according to the desired thickness of the layer and the desired optical characteristic of the emission spectrum.

In an exemplary procedure, a host matrix is prepared in non-solid form (e.g. as a gel). SNP material is dissolved in organic solvents such as Toluene. The weight of the SNP material divided by the phosphor powder weight is between 0.2% and 10%. The SNP in organic solvent solution is first added to the host mixture while stirring. The phosphor powder is added and the SNP/phosphor/host mixture is stirred to obtain a homogenous mixture. The SNP/phosphor/host mixture in then vacuumed until no bubbles or organic solvent are left. The mixture is then ready for dispensing on a LED and for the following curing process.

One-part materials (e.g. silicones, epoxies or polymers) contain all the ingredients needed to produce a cured material. They use external factors—such as moisture in the air, heat, or the presence of ultraviolet light—to initiate, speed, or complete the curing process. It is also possible to use hosts that are single part to mix the SNP and phosphor inside. A particular embodiment is to embed the phosphor and SNP components in one-part hosts that are UV-curable.

Many hosts (e.g. silicones, epoxies) are available as two-part systems that segregate the reactive ingredients to prevent premature initiation of the cure process. They often use the addition of heat to facilitate or speed cure. We define the non-reactive part as "Part A" and the reactive part as "Part B". In these systems we mix the SNP material to either part of the two-part system, preferably to the non-reactive part, Part A. In such an embodiment, the SNP in Part A can be stored for long time and applied to create a mixture with the phosphor and Part B when needed. In other embodiments, the SNP can be added directly into the host during the mixing of the reactive part of the host with the non-reactive part.

Figure 4A:
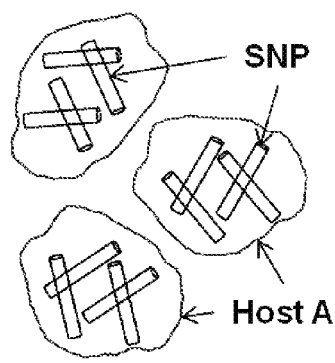
FIG. 4A shows schematically micron and submicron beads of RSNP inserted in a compatible host A.
Figure 4B:
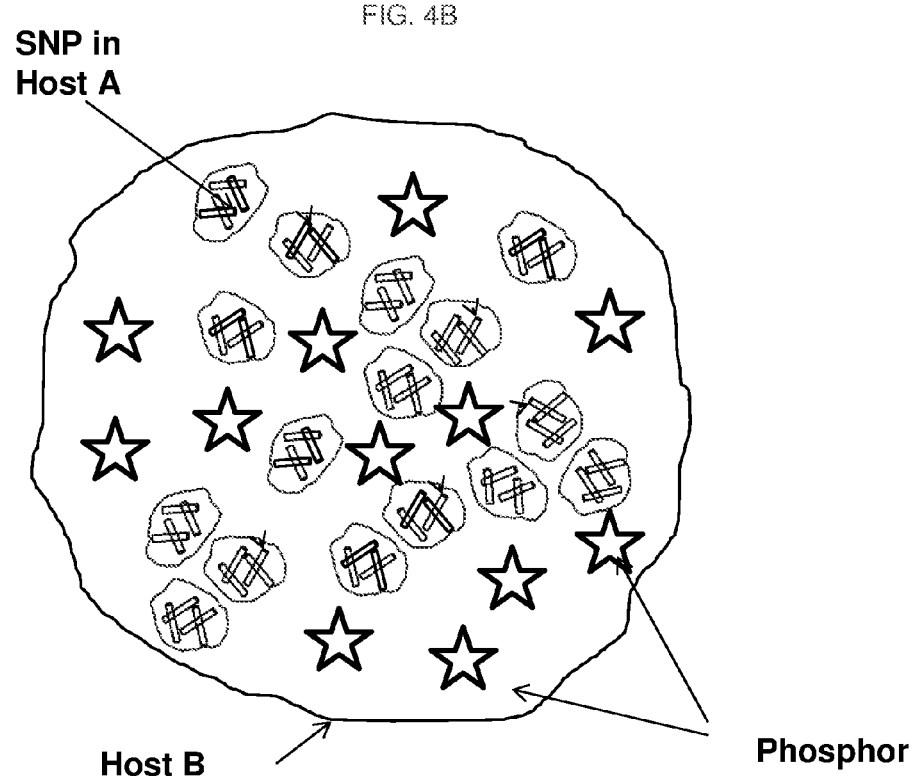
FIG. 4B shows schematically the beads of FIG. 4A embedded in combination with phosphor particles in a host B, exemplarily silicone.

In another embodiment the insertion procedure is divided into two steps. In the first step, the SNPs covered by ligands, are inserted into a host A (e.g. a polymer, a silicone, a clay, silica, etc.) to provide a homogenous mixture with no clusters and bubbles and no "extra" chemical interaction between SNPs or ligands and the host. Host A is then dried and hardened (e.g. via polymerization, heating, vacuum treatment, UV curing, etc.) with the NP encapsulated in it (see FIG. 4A). Host A with the SNP encapsulated in it are then mechanically ground into micron-scale and sub micron-scale beads. In the second step, the beads are mixed with compatible or non-compatible host B (e.g. a polymer, a silicone, a clay, silica, etc different then host A), as in FIG. 4B. The final product includes beads of SNPs encapsulated by host A homogenously inserted into host B.

Tables 1 and 2 summarize various exemplary embodiments of phosphor+RSNP and phosphor+SNP combinations made according to the invention. In some embodiments, these combinations may be included in a host matrix such as silicone or polymer. In some embodiments, these combinations may be included in layers with a host matrix such as a silicone or a polymer. These combinations have advantageous physical parameters and optical performances for lighting and display applications. The exemplary embodiments summarized in Tables 1 and 2 should not be considered as limiting the invention in any way.

TABLE 1

Phosphor-SNP combinations (mixtures) included in a host matrix

| SNP type | SNP length [nm] | SNP Emission [nm] | $AR^a_{red}$ | $AR^b_{green}$ | (SNP/ Phosphor) by weight [%] | Host | ($LC^c$/ Host) by weight | SNP PL Red Shift$^d$ [nm] |
|---|---|---|---|---|---|---|---|---|
| RSNP: CdSe\CdS ZnSe\CdS CdSe\CdS\ | 8-100 | 580-680 | For RSNP length 8-100 nm AR > 3.5:1 | For RSNP length 8-100 nm AR > 2.5:1 | 0.1%-10% | Silicone$^e$ | 5-50% | <8 |

TABLE 1-continued

Phosphor-SNP combinations (mixtures) included in a host matrix

| SNP type | SNP length [nm] | SNP Emission [nm] | $AR^a_{red}$ | $AR^b_{green}$ | (SNP/Phosphor) by weight [%] | Host | ($LC^c$/Host) by weight | SNP PL Red Shift$^d$ [nm] |
|---|---|---|---|---|---|---|---|---|
| ZnS<br>CdSe\CdZnS<br>CdSe\CdZnS\<br>ZnS | | | For RSNP length 60-100 nm AR > 10:1 | For RSNP length 60-100 nm $AR^c$ > 6:1 | | | | |
| RSNP:<br>CdSe\CdS<br>ZnSe\CdS<br>CdSe\CdS\<br>ZnS<br>CdSe\CdZnS<br>CdSe\CdZnS\<br>ZnS | 8-100 | 580-680 | For RSNP length 8-100 nm AR > 3.5:1 For RSNP length 60-100 nm AR > 10:1 | For RSNP length 8-100 nm AR > 2.5:1 For rods length 60-100 nm AR > 6:1 | 0.1%-10% | Polymer$^f$ | 5-50% | <8 |
| SNP:<br>CdSe\CdS<br>ZnSe\CdS<br>CdSe\CdS\<br>ZnS<br>CdSe\CdZnS<br>CdSe\CdZnS\<br>ZnS | 8-100 | 580-680 | | AR > 3:1 | 0.1%-10% | Silicone$^e$ | 5-50% | <8 |
| SNP:<br>CdSe\CdS<br>ZnSe\CdS<br>CdSe\CdS\<br>ZnS<br>CdSe\CdZnS<br>CdSe\CdZnS\<br>ZnS | 8-100 | 580-680 | | AR > 3:1 | 0.1%-10% | Polymer$^f$ | 5-50% | <8 |

Markings in Table 1:
$^a$AR$_{red}$ is the ratio between the absorbance at 455 nm to the maximal absorbance in a wavelength range between 580-700 nm, i.e. AR$_{red}$ = (Absorbance$_{455\ nm}$/max(Absorbance$_{580-700\ nm}$);
$^b$AR$_{green}$ is the ratio between the absorbance at 455 nm to the maximal absorbance in a wavelength range between 520-580 nm, i.e. AR$_{green}$ = (Absorbance$_{455\ nm}$/max(Absorbance$_{520-580\ nm}$);
$^c$LC/Host is the weight of the phosphor-SNP mixture divided by the weight of the host material in percentage;
$^d$PL Red shift is the difference in nanometers between the CWL measured in Toluene at low OD (<0.1) and the CWL measured for the phosphor-SNP mixture;
$^e$A silicone with suitable optical and mechanical properties can be selected from various commercial suppliers;
$^f$The polymer can be selected from list given in definitions.

TABLE 2

SNPs encapsulated by Host$_A$ and phosphor included in a Host$_A$ matrix

| SNP type | RSNP length [nm] | RSNP Emission [nm] | $AR^a_{red}$ | $AR^b_{green}$ | (SNP/Host$_A^c$) by weight [%] | (SNP in Host$_A^c$)/Phosphor by weight [%] | ($LC^e$/Host$_B^f$) by weight | SNP PL Red Shift$^g$ [nm] |
|---|---|---|---|---|---|---|---|---|
| RSNP:<br>CdSe\CdS<br>ZnSe\CdS<br>CdSe\CdS\<br>ZnS<br>CdSe\CdZnS<br>CdSe\CdZnS\<br>ZnS | 8-100 | 580-680 | For RSNP length 8:-100 nm ARred > 3.5:1 For RSNP length 60-100 nm ARred > 7:1 | For RSNP length 8-100 nm ARgreen > 2.5:1 For RSNP length 60-100 nm ARgreen > 6:1 | 0.5%-10% | 50%-1%$^h$ | 5-50% | <8 |
| RSNP:<br>CdSe\CdS<br>ZnSe\CdS<br>CdSe\CdS\<br>ZnS<br>CdSe\CdZnS<br>CdSe\CdZnS\<br>ZnS | 8-100 | 580-680 | For RSNP length 8-100 nm ARred > 3.5:1 For RSNP length 60-100 nm ARred > 7:1 | For RSNP length 8-100 nm ARgreen > 2.5:1 For rods length 60-100 nm ARgreen > 6:1 | 0.5%-10% | 50%-1%$^h$ | 5-50% | <8 |
| SNP:<br>CdSe\CdS<br>ZnSe\CdS | 8-100 | 580-680 | ARred > 3.5:1 | ARgreen > 2.5:1 | 0.5%-10% | 50%-1%$^h$ | 5-50% | <8 |

TABLE 2-continued

SNPs encapsulated by Host$_A$ and phosphor included in a Host$_A$ matrix

| SNP type | RSNP length [nm] | RSNP Emission [nm] | AR$^a_{red}$ | AR$^b_{green}$ | (SNP/ Host$_A^c$) by weight [%] | (SNP in Host$_A^c$)/ Phosphor$^d$ by weight [%] | (LC$^e$/ Host$_B^f$) by weight | SNP PL Red Shift$^g$ [nm] |
|---|---|---|---|---|---|---|---|---|
| CdSe\CdS\ZnS | | | | | | | | |
| CdSe\CdZnS | | | | | | | | |
| CdSe\CdZnS\ZnS | | | | | | | | |
| SNP: CdSe\CdS ZnSe\CdS CdSe\CdS\ZnS CdSe\CdZnS CdSe\CdZnS\ZnS | 8-100 | 580-680 | ARred > 3.5:1 | ARgreen > 6:1 | 0.5%-10% | 50%-1% $^h$ | 5-50% | <8 |

Markings in Table 1:
$^a$AR$_{red}$ is the ratio between the absorbance at 455 nm to the maximal absorbance in the wavelength range between 580-700 nm, i.e. AR$_{red}$ = (Absorbance$_{455\,nm}$/max(Absorbance$_{580\text{-}700\,nm}$));
$^b$AR$_{green}$ is the ratio between the absorbance at 455 nm to the maximal absorbance at wavelength range between 520-580 nm, i.e. AR$_{green}$ = (Absorbance$_{455\,nm}$/max(Absorbance$_{520\text{-}580\,nm}$));
$^c$The Host$_A$ can be selected from list given in definitions for polymer and in addition silica, epoxy or clay;
$^d$The phosphor can be selected from list given in definitions;
$^e$LC/Host$_B$ is the weight of the phosphor-SNP mixture divided by the weight of the matrix host material in percentage;
$^f$A host material with suitable optical and mechanical properties can be selected from various commercial suppliers;
$^g$PL Red shift is the difference in nanometers between the CWL measured in Toluene at low OD (<0.1) and the CWL measured for the phosphor-SNP mixture
$^h$ For low percentage of SNP in polymer, use high percentage of light converters to host and vice versa.

Figure 5A:
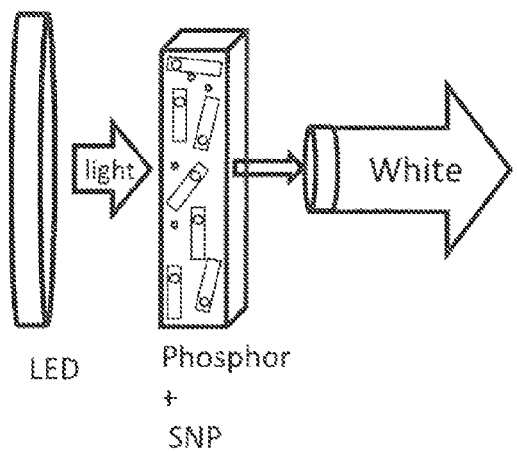
FIG. 5A shows schematically a lighting device according to an embodiment of the invention, in which improved white light is produced by a single layer comprising a phosphor-SNP combination.
Figure 5B:
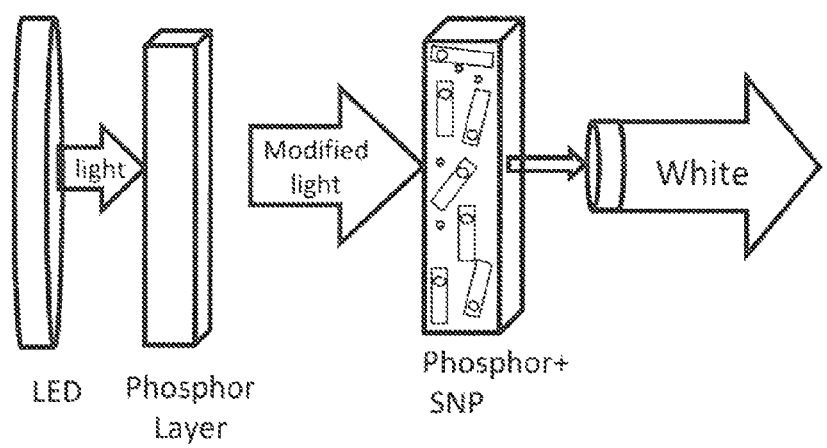
FIG. 5B shows schematically a lighting device according to another embodiment of the invention, in which improved white light is produced by two separate layers, a first layer comprising phosphor particles and a second layer comprising a phosphor-SNP combination.
Figure 5C:
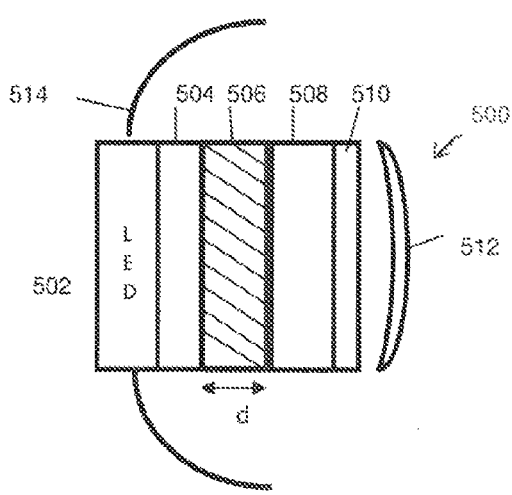
FIG. 5C shows schematically a lighting device according to another embodiment of the invention, in which improved white light is produced by a SNP/phosphor/host mixture deposited directly on the LED element.

FIG. 5A shows schematically a lighting device according to an embodiment of the invention, in which improved white light is produced by a single layer comprising a phosphor-SNP combination. FIG. 5B shows schematically a lighting device according to another embodiment of the invention, in which improved white light is produced by two separate layers, a first layer comprising phosphor particles and a second layer comprising a phosphor-SNP combination. FIG. 5C shows schematically a lighting device 500 which includes a SNP and phosphor mixture in silicone conversion layer according to an embodiment of the invention. Device 500 includes a blue or UV LED light source 502, an optional spacer layer (or air as spacer) 504, a SNP and phosphor mixture in host conversion layer 506, an optional encapsulation layer 508, an optional transmissive optical element 510 for light extraction to desired directionality, an optional refractive element such as a lens 512 to collimate or focus the light, and an optional reflective element 514 placed behind and around the LED element to collect and direct emission from large angles to the correct output direction. In some embodiments, the high refractive index of a SNP layer with a high-loading ratio is preferred in order to increase the light extraction from the LED chip.

Example 1: Phosphor-RSNP Combination in Silicone

35×5.6 nm CdSe/CdS RSNPs emitting at 638 nm were first prepared using a procedure similar to that described in L. Carbone et al. "Synthesis and Micrometer-Scale Assembly of Colloidal CdSe/CdS Nanorods Prepared by a Seeded Growth Approach" Nano Letters, 2007, 7 (10), pp 2942-2950. 0.5 g of RTV615A (Momentive, 22 Corporate Woods Boulevard, Albany, N.Y. 12211 USA) was stirred with 0.15 g of RTV615B for 10 minutes. 4.0 mg of the RSNPs were dissolved in 0.4 ml Toluene. 615 mg of yellow phosphor (BYW01A, PhosphorTech, 351 Thornton Rd Ste. 130, Lithia Springs, Ga. 30122, USA) were provided to give a RSNP to Phosphor weight ratio of 4/615, i.e. ~0.65%. The RSNP solution was added to the silicone RTV mixture while stirring. The BYW01A phosphor was then added and the RSNP/phosphor/silicone solution was stirred for 15 minutes. The RSNP/phosphor/silicone solution in then vacuumed until no bubbles were left. The solution was then poured on a glass substrate and sandwiched using another glass substrate, with 520 μm-thick spacers between them. The mixture conversion material was then placed on a hot plate at 100 C for 1 hour, after which the solution became solid. The final film thickness was 520 μm.

Figure 6A:
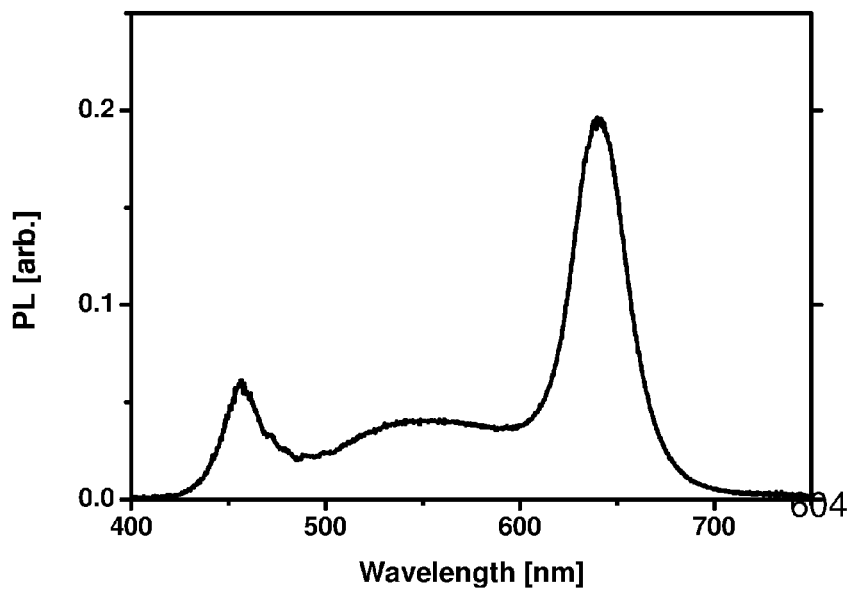
FIG. 6A shows the optical spectrum provided by a layer prepared as described Example 1 when deposited on a 455 nm LED.
Figure 6B:
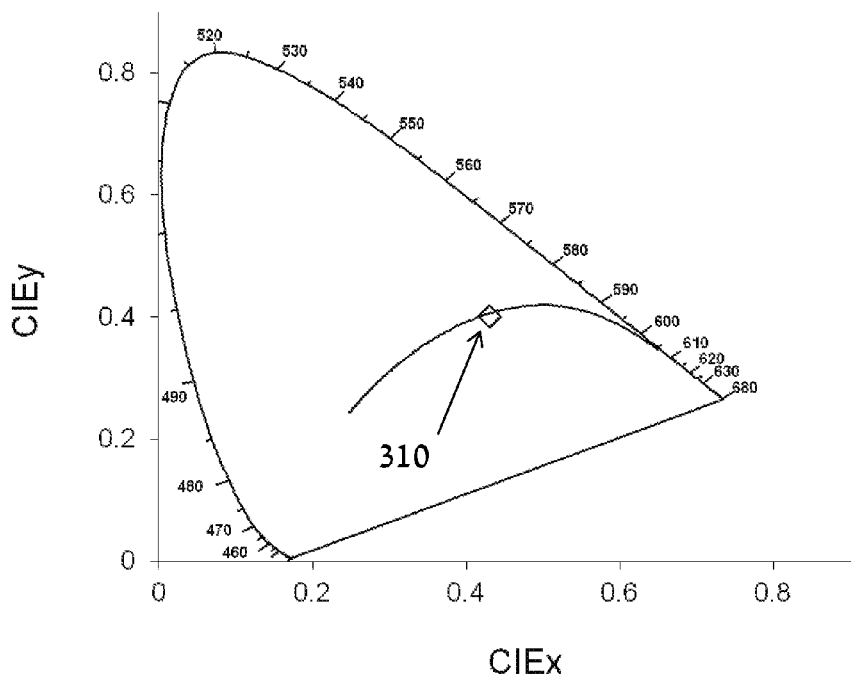
FIG. 6B shows CIE 1931 diagrams showing the CIE coordinates of the spectrum shown in FIG. 6A.

In an embodiment, a combination as in Example 1 with 490 μm thickness was deposited on a 455 nm LED. The performance of this layer and LED are shown in FIGS. 6A-6B. FIG. 6A shows the optical spectrum provided by the conversion material described above when deposited on a 455 nm LED. FIG. 6B shows CIE 1931 diagrams showing the CIE coordinates of the spectrum shown in FIG. 6A. The light has a CCT of 3080 K and a CRI of 86. Other mixture ratios in combination with other LEDs can provide light sources with a variety of colors and in particular a variety of white light with different CCT values. The types of phosphors, the types, sizes and shapes of the RSNPs, and the ratio between the phosphor species and the RSNP species can be tailored according to the desired needs. For example, adding more red emitting RSNPs would decrease the blue and therefore also the green-yellow of the phosphor, while strengthening the red. In particular, a CCT<5000 K with CRI>70, or even a CCT<3500 with CRI>80 can be provided for other mixing ratios (not shown).

Example 2: Insertion of RSNP Encapsulated in Polymer into Silicone

Figure 7:
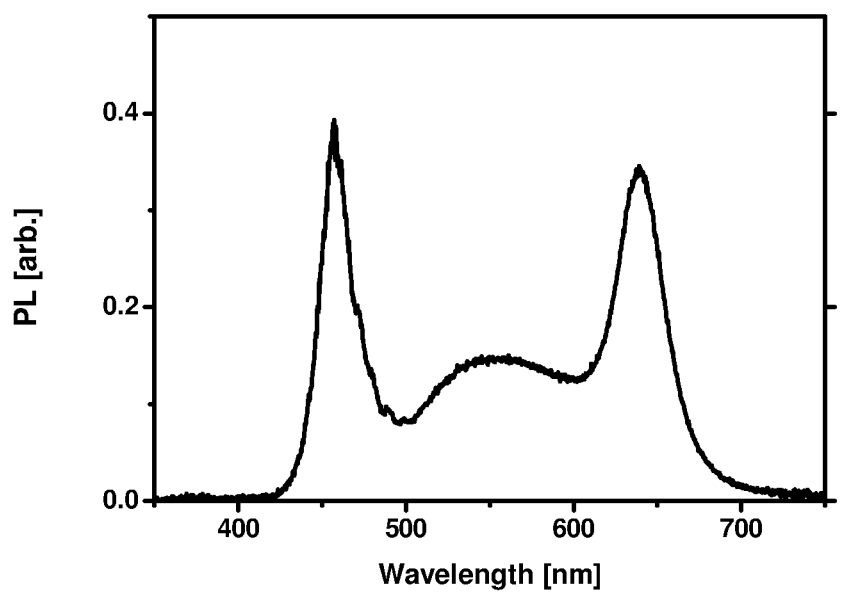
FIG. 7 shows the spectrum of a blue LED with a material prepared as described in Example 2 deposited on a LED emitting surface

The RSNPs prepared as described in Example 1 were embedded in PVB with 3% loading ratio (weight) and were ground to fine powder. The final powder mean particle size was less than 15 μm. 1.5 g of RTV615A (Momentive, 22 Corporate Woods Boulevard, Albany, N.Y. 12211 USA) was stirred with 0.15 g of RTV615B for 10 min. 77 mg of the RSNP/PVB powder was added to the silicone mixture while stirring. 345 mg of Yttrium Aluminum Garnet phosphor (BYW01A, PhosphorTech, 351 Thornton Rd Ste. 130, Lithia Springs, Ga. 30122, USA) were added and the solution was stirred for 15 minutes. The RSNP/phosphor/silicone RTV solution was then vacuumed until no bubbles were left. The solution was then poured on a glass substrate and sandwiched using another glass substrate. 250 μm-thick spacers were positioned between the two glass substrates to obtain the desired film thickness. The sandwiched structure was then placed on a hot plate at 100 C for 1 hour, after which the solution became solid. The final film thickness was ~250 μm. FIG. 7 shows the optical spectrum provided by the layer described above when deposited on a 455 nm LED. The CIE color coordinates of the spectral emission of the LED coated with the light converting materials was CIE x=0.35, CIE y=0.31.

The invention has been described with reference to embodiments thereof that are provided by way of example and are not intended to limit its scope. The described embodiments comprise different features, not all of which are required in all embodiments of the invention. Some embodiments of the invention utilize only some of the features or possible combinations of the features. Variations of embodiments of the described invention and embodiments of the invention comprising different combinations of features than those noted in the described embodiments will occur to persons of ordinary skill in the art. The scope of the invention is limited only by the following claims.

All patents and publications mentioned in this specification are herein incorporated in their entirety by reference into the specification, to the same extent as if each individual patent or publication was specifically and individually indicated to be incorporated herein by reference. In addition, citation or identification of any reference in this application shall not be construed as an admission that such reference is available as prior art.

The invention claimed is:

1. A material composition for use in light conversion comprising:
    a) a phosphor material; and
    b) at least one species of semiconductor seeded nanoparticle (SNP) material having a central emission wavelength (CWL) in the range 580-680 nm,
    wherein the SNP material comprises rod shaped SNP (RSNP) and is encapsulated in a first host material, and wherein the phosphor material and the RSNP encapsulated in said first host material are homogenously mixed together in appropriate selected amount to provide an absorption ratio (AR) of optical absorbance at 455 nm to a maximum value of optical absorbance in the range of 580-700 nm greater than 3.5:1, and an AR between absorbance at 455 nm and a maximum value of absorbance in the wavelength range of 520-580 nm greater than 2.5:1; and
    wherein the material composition is further characterized by having a photoluminescence (PL) shift smaller than 8 nm between a CWL measured for the SNP in Toluene at OD<0.1 and a CWL measured in the material composition.

2. The material composition of claim 1, wherein the amount of the RSNP is between 0.1 wt. % and 10 wt. % based on 100 wt. % of the phosphor material.

3. The material composition of claim 1, wherein the AR between absorbance at 455 nm and a maximum value of absorbance in the wavelength range of ~580-700 nm is greater than 7:1.

4. The material composition of claim 1, further characterized by having the AR between absorbance at 455 nm and a maximum value of absorbance in the wavelength range of 520-580 nm is greater than 6:1.

5. The material composition of claim 1, further comprising at least one of the following: (i) at least one species of excess organic ligands not bound to any RSNP surface; and (ii) a second host matrix material which incorporates the phosphor and the RSNP.

6. The material composition of claim 1, further comprising a second host matrix material which incorporates the phosphor and the RSNP, the second host matrix material being a silicone, epoxy or polymer.

7. The material composition of claim 1, further comprising a second host matrix material which incorporates the phosphor and the RSNP, wherein a weight percentage of the phosphor and the RSNP is 5 wt. % to 50 wt. % based on 100 wt. % of the second host matrix.

8. The material composition of claim 1, wherein the phosphor material includes particulates with emitting centers of a rare-earth element.

9. The material composition of claim 1, characterized by at least one of the following: (1) the phosphor material is selected from the group consisting of Garnet-based phosphors, Silicate-based phosphors, Orthosilicate-based phosphors, Thiogallate-based phosphors, Sulfide-based phosphors and Nitride-based phosphors; and (2) the RSNP material includes a material selected from the group consisting of II-VI, III-V IV-VI and I-III-VI$_2$ semiconductors.

10. The material composition of claim 1, wherein the RSNP includes a material selected from the group consisting of II-VI, III-V IV-VI and I-III-VI$_2$ semiconductors, the RSNP having one of the following configurations: (a) a core/shell structure with materials selected from the group consisting of CdSe/CdS, CdSeS/CdS, ZnSe/CdS, ZnCdSe/CdS, CdSe/CdZnS, CdTe/CdS, InP/ZnSe, InP/CdS, InP/ZnS and CuInS$_2$/ZnS, and (b) a core/double shell structure with materials selected from the group consisting of CdSe/CdS/ZnS, CdSe/CdZnS/ZnS, ZnSe/CdS/ZnS, InP/ZnSe/ZnS, InP/CdS/ZnS and InP/CdZnS/ZnS.

11. The material composition of claim 1, wherein the amount of the RSNP is 0.5 wt. % to 10 wt. % based on 100 wt. % of the phosphor material.

12. The material composition of claim 1, wherein the amount of the encapsulated RSNP is 1 wt. % to 50 wt. % based on 100 wt % of the phosphor.

13. A light conversion layer comprising the composition of matter of claim 1.

* * * * *